US011750243B2

(12) United States Patent
Rohleder et al.

(10) Patent No.: US 11,750,243 B2
(45) Date of Patent: Sep. 5, 2023

(54) LOW COST POWER LINE MODEM

(71) Applicant: Microchip Technology incorporated, Chandler, AZ (US)

(72) Inventors: Marco Rohleder, Hamminkeln (DE); Stefan Weiers, Heidelberg (DE)

(73) Assignee: Microchip Technology Incorporated, Chandler, AZ (US)

( * ) Notice: Subject to any disclaimer, the term of this patent is extended or adjusted under 35 U.S.C. 154(b) by 569 days.

(21) Appl. No.: 17/037,919

(22) Filed: Sep. 30, 2020

(65) Prior Publication Data
US 2021/0258043 A1 Aug. 19, 2021

Related U.S. Application Data

(60) Provisional application No. 62/976,422, filed on Feb. 14, 2020.

(51) Int. Cl.
*H04B 3/54* (2006.01)
*A24F 40/65* (2020.01)
*A24F 40/90* (2020.01)
*H02J 7/00* (2006.01)
(Continued)

(52) U.S. Cl.
CPC .............. *H04B 3/54* (2013.01); *A24F 40/65* (2020.01); *A24F 40/90* (2020.01); *H02J 7/0044* (2013.01); *H03K 17/6871* (2013.01); *H03B 5/20* (2013.01)

(58) Field of Classification Search
CPC .. H02J 1/06; H02J 7/00; H02J 7/00032; H02J 7/00034; H03K 17/00; A24F 40/00; A24F 40/90; A24F 40/95; H04B 3/54
See application file for complete search history.

(56) References Cited

U.S. PATENT DOCUMENTS 9,450,419 B2 9/2016 Julicher et al.
2013/0070863 A1* 3/2013 Ohl .................. H04L 12/40045
375/257

FOREIGN PATENT DOCUMENTS

CN   108649643 A   10/2018   ............. A24F 47/00
CN   108827372 A   11/2018   ............. G01D 21/02
(Continued)

OTHER PUBLICATIONS

International Search Report and Written Opinion, Application No. PCT/US2020/060087, 13 pages, dated Feb. 17, 2021.

*Primary Examiner* — David S Huang
(74) *Attorney, Agent, or Firm* — SLAYDEN GRUBERT BEARD PLLC

(57) ABSTRACT

A system for transmitting power and data through a two pin connection interface may have a first device having a power source, a first microcontroller with a first communication peripheral coupled with a first pin and a first control port coupled with a gate of a first MOSFET whose switch path couples the power source with the first pin; and a second device having a battery, a second microcontroller with a second communication peripheral coupled with a first pin and a second control port coupled with a gate of a second MOSFET whose switch path couples the battery with the first pin of the second device. When the devices are coupled, the MOSFETs are synchronously turned on and off, wherein during an off-cycle a data transfer between the first and second device takes place through the first and second communication peripherals of the first and second device, respectively.

23 Claims, 5 Drawing Sheets

(51) Int. Cl.
*H03K 17/687* (2006.01)
*H03B 5/20* (2006.01)

(56) References Cited

FOREIGN PATENT DOCUMENTS

| WO | 2019/173923 A1 | 9/2019 | ............. A24F 47/00 |
| WO | 2019/227364 A1 | 12/2019 | ................ H02J 7/00 |

\* cited by examiner

LOW COST POWER LINE MODEM

RELATED APPLICATIONS

The present disclosure claims priority to U.S. Provisional Patent Application No. 62/976,422, filed Feb. 14, 2020, the contents of which are hereby incorporated in their entirety.

TECHNICAL FIELD

The present disclosure relates to low cost power modems, in particular to a system and method for transmitting data and power through a two wire interface.

BACKGROUND

Many battery operated devices do not only require power from a charger to charge their batteries but also want to exchange data between the charger and the battery operated device to determine battery status, life cycle, etc. However, there is a demand that a connector for the charger does not require any additional pins in order to keep the manufacturing costs low. For example, e-cigarettes comprise a battery operated holder and associated charger. The holder can be inserted into the charger for recharging the batteries of the holder. The charger may also comprise, in particular, a larger battery and may further comprise an input for power supply adapter or a USB connection. Other portable devices may have similar arrangements.

A combined power and input/output system for an electronic device is known from U.S. Pat. No. 9,450,419 and includes a host system, a target system operably coupled to the host system via a combined power and I/O line. The system further includes a power boost circuit in the target system for enabling a higher voltage target device. These types of systems require very little power as they merely need to charge a capacitor in the target system that provides a sufficient charge to operate the target device. Once the connection is severed, these types of systems cannot operate and are not intended to operate on their own. For communication purposes, these types of system modulate the power supply source signal directly, as shown in FIG. 1A of U.S. Pat. No. 9,450,419 with transistor 130 which is unsuitable for high power systems that, for example, charge a battery in the target system.

SUMMARY

Hence there exists a demand for a simple approach to exchange data between a first electronic device and a second battery operated electronic device with low part count and low PCB space requirements, in particular, in cost sensitive applications.

According to an embodiment, a system for transmitting power and data through a two pin connection interface may comprise a first device comprising a power source or a connection to a power source, a first microcontroller coupled with the power source and comprising a first communication peripheral coupled with a pin of the first device and a first control port coupled with a gate of a first MOSFET of the first device whose switch path couples the power source with the pin of the first device; and a second device comprising a battery, a second microcontroller comprising a second communication peripheral coupled with a pin of the second device and a second control port coupled with a gate of a second MOSFET whose switch path couples the battery with the pin of the second device, wherein the pin of the second device is configured to be coupled with the pin of the first device; wherein, when the pin of the second device is coupled with the pin of the first device said first and second MOSFET are synchronously turned on and off, wherein an off-cycle is short in comparison to an on-cycle, and wherein during an off-cycle a data transfer between the first and second device takes place through the first and second communication peripherals of the first and second device, respectively.

According to a further embodiment, at least the microcontroller of the second device may comprises a tunable RC oscillator. According to a further embodiment, the tunable RC oscillator can be tuned through a special function register of the microcontroller. According to a further embodiment, the tunable RC oscillator can be tuned through programmable fuses. According to a further embodiment, the first device can be a charger device and the second device can be a holder device. According to a further embodiment, the holder device can be configured to be plugged into the charger device. According to a further embodiment, the holder device can be an e-cigarette and wherein a ratio between transmitting data and supplying power is in the range of 5-10%. According to a further embodiment, the system may further comprise an inductor coupled between the switch path of the second MOSFET and the battery and a reverse biased diode coupled between ground and a node between the switch path of the second MOSFET and the inductor. According to a further embodiment, the system may further comprise a capacitor in parallel with the battery. According to a further embodiment, the first device can be configured to operate as a master and the second device is configured to operate as a slave, wherein during a synchronization cycle, the master is configured to deliver power to the slave interrupted by pauses having a predefined length and wherein the slave is configured to synchronize to the master and to transmit a confirmation of synchronization back to the master. According to a further embodiment, the slave can be configured to insert or remove dead cycles to adjust to a given timing frame by the master. According to a further embodiment, the microcontroller of the slave may comprise a tunable RC oscillator and wherein the slave is configured to tune the tunable RC oscillator to synchronize with the master. According to a further embodiment, the first device may further comprise a first inductor coupled between the switch path of the first MOSFET and the first pin of the first device and a third MOSFET controlled by the first microcontroller having a switch path coupled between ground of the first device and a node between the switch path of the first MOSFET and the first inductor; and wherein the second device further comprises: a second inductor coupled between the switch path of the second MOSFET and the first pin of the second device and a fourth MOSFET controlled by the second microcontroller having a switch path coupled between ground of the second device and a node between the switch path of the second MOSFET and the second inductor. According to a further embodiment, the system may further comprise within the first device a first resistor between the power source and the first MOSFET, wherein the first resistor is further coupled with the first microcontroller. According to a further embodiment, the system may further comprise within the second device a second resistor between the ground of the second device and the switch path of the fourth MOSFET, wherein the second resistor is further coupled with the second microcontroller. According to a further embodiment, the power source is a battery.

According to another embodiment, a method for transmitting power and data through a two pin connection interface comprising a first device having a power source, a first microcontroller coupled with the power source and comprising a first communication peripheral coupled with a first pin of the first device and a first control port coupled with a gate of a first MOSFET whose switch path couples the power source with the first pin of the first device, and a second device having a battery, a second microcontroller and comprising a second communication peripheral coupled with a first pin of the second device and a second control port coupled with a gate of a second MOSFET whose switch path couples the battery with the first pin of the second device, wherein the method may comprise the steps of: coupling the first device with the second device through said respective first pins; and synchronously turning said first and second MOSFET on and off, wherein an off-cycle is short in comparison to an on-cycle, and wherein during an off-cycle a data transfer between the first and second device takes place through the first and second communication peripherals of the first and second device, respectively.

According to a further embodiment of the above method, the method may further comprise the step of synchronizing a system clock of the second microcontroller to a system clock of the first microcontroller. According to a further embodiment of the above method, the method may further comprise the step of synchronizing a system clock of the second microcontroller to a system clock of the first microcontroller. According to a further embodiment of the above method, the first device may operates as a master and the second device operates as a slave, wherein during a synchronization cycle, the master delivers power to the slave interrupted by pauses having a predefined length and wherein the slave uses an interval length between two pauses for synchronization to the master. According to a further embodiment of the above method, the slave may insert or remove dead cycles to adjust to a given timing frame by the master. According to a further embodiment of the above method, the microcontroller of the slave may comprise a tunable RC oscillator and wherein the slave tunes the tunable RC oscillator to synchronize with the master.

According to yet another embodiment, a system for transmitting power and data through a two pin connection interface may comprise first device comprising: a power source or a connection to a power source, a first microcontroller coupled with the power source and comprising a first communication peripheral coupled with a first pin of a first connector of the first device and a first control port coupled with a gate of a first MOSFET whose switch path couples the power source with the first pin of the first connector, a first inductor coupled between the switch path of the first MOSFET and the first pin of the first connector and a third MOSFET controlled by the first microcontroller having a switch path coupled between ground of the first device and a node between the switch path of the first MOSFET and the first inductor; a second device comprising: a battery, a second microcontroller coupled with the battery and comprising a second communication peripheral coupled with a first pin of a second connector of the second device and a second control port coupled with a gate of a second MOSFET whose switch path couples the battery with the first pin of the second connector, wherein the first pin of the second connector is configured to be coupled with the first pin of the second connector, a second inductor coupled between the switch path of the second MOSFET and the first pin of the second connector and a fourth MOSFET controlled by the second microcontroller having a switch path coupled between ground of the second device and a node between the switch path of the second MOSFET and the second inductor; wherein, when said first and second device are coupled through said respective first pins, the first, second, third and fourth MOSFET are controlled to operate the coupled devices in a buck mode and/or a boost mode, wherein during a communication cycle said first, second, third, and fourth MOSFET are synchronously turned off, wherein during an off-cycle a data transfer between the first and second device takes place through the first and second communication peripherals of the first and second device, respectively.

DETAILED DESCRIPTION

Figure 1:
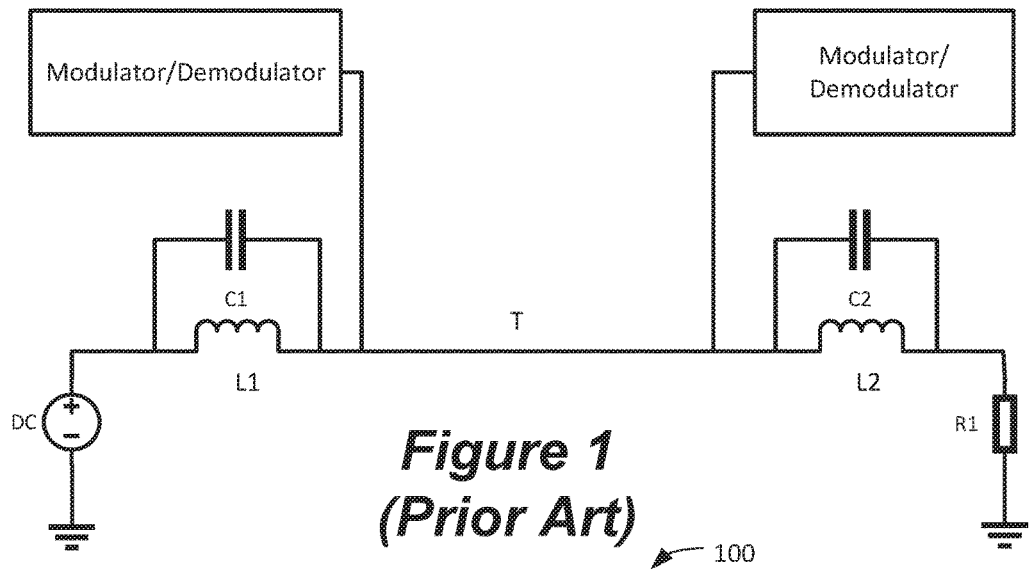
FIG. 1 shows a conventional power modem capable of transmitting power and data through a two wire connection.

In a conventional power line modem as shown for example in FIG. 1, power is delivered continuously and data is modulated on a separate RF carrier, which are both carried on a single transmission line T. FIG. 1 shows on the left side a power source DC and parallel coupled inductor L1 and capacitor C1 coupling the power source DC with the transmission line T. A demodulator is coupled with the transmission line T on the power supply side. The right side of FIG. 1 shows the device that receives the power having a load R1 coupled with the transmission line T through another parallel coupled pair of inductor L2 and capacitor C2. A modulator is directly coupled with the transmission line T within the device. In one application, power is delivered from the power supply side to the device that receives the power, and data is transmitted from the device that receives the power to the power supply side. However, there is no restriction of the data flow direction as indicated in FIG. 1.

These types of power line modems require very large blocking inductors due to low RF frequency which is typically ~125 kHz. Furthermore, a high amount of parts is needed resulting in a relatively large PCB area. Such arrangements further only allow for a low data throughput, typically in the range of a couple of kBits/s. For example, the inductors may need to be rated in the range of 10 uH, 4 amps which are large (13×10 mm) and costly.

According to various embodiments, a power line modem is proposed that provides an interrupted power delivery. For example, the power delivery can be interrupted periodically, for example, every 100 μs or randomly for a predetermined period of time. During these off-cycles, a modulated high frequency (HF)-burst for transmission of data can be performed from either side. According to some embodiments, transmission may always be initiated by the master, independent of data transmission direction.

To keep efficiency as high as possible, the interruption window should be as small as possible. This requires a modulation that should be as fast as possible with any given available hardware. To allow for high power transmission, the off-cycle is kept short, for example, in the range of 10 μs. During the off-cycle no power is delivered to the power receiving device. The ratio between transmitting data and supplying power can vary and, for example, for an e-cigarette application may be preferably in the range of 1:20 to 1:10.

According to various embodiments, both a first device, i.e. the power supplying device, and a second device, i.e. the power receiving device, each comprise a MOSFET, preferably a low-on resistance MOSFET dimensioned for the entire load current, to separate the transmission line 100c, connector or interface from the power source and power sink, respectively. Thus, once each side has turned off their respective MOSFET, a high speed data transmission can take place between the first device and the second device via the established connection. The connection between the first device and the second device can be a connector that directly connects, for example a charger (first device) with a holder device (second device). Thus, instead of actual wires or a connection cable, the interface may comprise a pair of connection pins such as male and female connection pins in the first device and the second device, respectively. The second device can then be inserted into the first device for charging via a suitable plug in provision within the first device. A pin is to be understood according to the present application to represent any suitable connector male or female pin or contact of a plug in provision or connector. Alternatively, the interface may comprise a two wire cable such as a twisted pair or a shielded two wire cable may be used.

Figure 2:
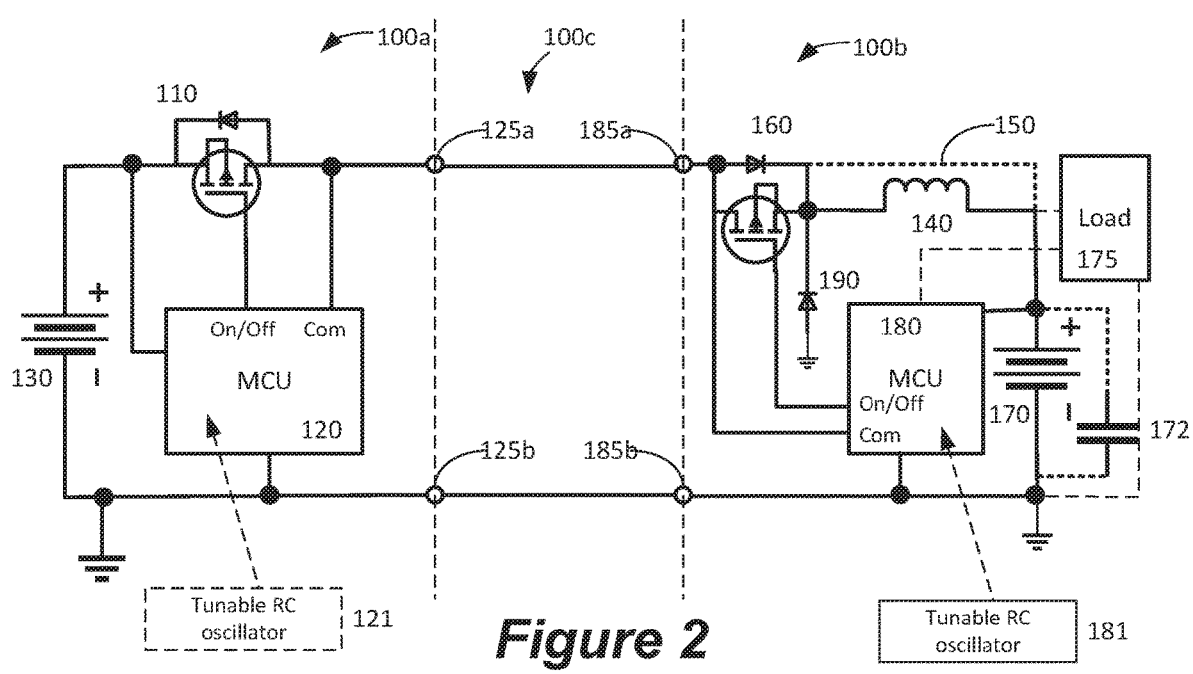
FIG. 2 shows a first embodiment of a first device and a second device.

FIG. 2 shows a first embodiment of a system 100 comprising as a first device a charger unit 100a, a transmission line and connector or two wire/pin interface 100c and, as a second device, a holder device 100b. The charger device 100a comprises a microcontroller 120. The device 100a is powered by a battery 130 or any other suitable external or internal power source, for example an AC line power adapter or a USB power source. Thus, the charger device 100a may have a power source or a connection to a power source. The microcontroller 120 controls a MOSFET 110 through its gate coupled with an I/O port of microcontroller 120. MOSFET 110 is preferably a power MOSFET. A switch path (source-drain path) of the MOSFET 110 which may comprise a parasitic reverse biased diode connects a positive pole of battery 130 with a first contact pin 125a in charger device 100a. The gate of MOSFET 110 maybe controlled by a general purpose I/O port of microcontroller 120 through software, or by a PWM peripheral, a timer or any other suitable peripheral of the microcontroller that can provide the protocol according to various embodiments. The microcontroller further comprises a communication port Com that is directly connected with first contact pin 125a. A second pin 125b in charger device 100a is connected with ground of the charger device 100a, a negative pole of battery 130 and a ground connection of microcontroller 120. In case of an AC charger, the local ground may be connected to an earth connection of an AC outlet. The communication port Com of the microcontroller may be coupled to any type of communication peripheral, such as, a universal synchronous/asynchronous receiver/transmitter (USART) operable to modulate a data signal on a single wire.

In the specific embodiment shown in FIG. 2, the interface 100c may not comprise any physical wires as shown in FIG. 2 but rather consist of the first and second contact pins 125a, b in the charger device 100a forming a first connector and a respective first and second contact pins 185a, b in the holder device 100b, forming a second connector, wherein the second connector of holder device 100b can be directly plugged into the first connector of charger device 100a. The charger device 100a may comprise a respective receiving area with the first connector that provides support for the holder device as known in the art. However, according to other embodiments, the interface 100c may also comprise a cable establishing a connection between the charger device 100a and the holder device 100b.

The holder device 100b comprises in one embodiment a microcontroller 180 that controls a respective MOSFET 160 through its gate, wherein the gate of MOSFET 160 is coupled to an I/O port of the microcontroller 180. MOSFET 160 is preferably a power MOSFET. The microcontroller 180 is powered by battery 170. The holder device 100b may also comprise a load powered by the battery 170 as indicated with numeral 175. For example, the load may be a heater element in an e-cigarette application that may be controlled by the microcontroller 180 through one or more control lines. The I/O port of microcontroller 180 can be configured similarly to the one discussed with respect to the charger device 100a. The MOSFET 160 again comprises a switch path (source-drain path) and parasitic diode that connects a first contact pin 185a of holder device 100b with a positive pole of battery 170. A second contact pin 185b of holder device 100b is coupled with ground of the holder device 100b, a negative pole of battery 170 and a ground connection of microcontroller 180. A communication port Com associated with a second communication peripheral of microcontroller 180, similar to the one discussed with respect to the charger device 100a, is directly coupled with the transmission line 100c through first contact pin 185a. In one embodiment the source of MOSFET 160 is coupled to the positive pole of battery 170 directly through a connection 150 as indicated with the dotted line. In another embodiment, the source of MOSFET 160 is coupled with battery 170 via an inductor 140, and connection 150 is not provided. In the latter embodiment, a capacitor 172 may also be provided in parallel with battery 170. In addition, the latter embodiment also comprises a diode 190 that is coupled in reverse bias between ground and the node between the source of MOSFET 190 and the inductor 140.

The system 100 as shown in FIG. 2 is suitable for transmitting power and data through a two pin connection interface, one pin connection, i.e. first contact pin 125a coupled to first contact pin 185a, transferring power and data and the other pin connection, i.e. second contact pin 125b coupled to second contact pin 185b, coupling the respective ground potentials of the devices. When the charger device 100a and holder device 100b are coupled through the two pin connection interface, the first and second MOSFETs are synchronously turned on and off as will be discussed in more detail below, wherein an off-cycle is short in comparison to an on-cycle, and wherein during an off-cycle a data transfer between the charger device 100a and holder device 100b takes place through respective first and second communication peripherals of the charger device 100a and holder device 100b with low current signals. Preferably, the off-cycle is about 5-10% of the on-cycle.

In comparison with the embodiment of FIG. 1, the inductors L1 and L2, as well as capacitors C1 and C2 are not required, at the cost of MOSFETs 110, 160, with the dotted connection instead of inductor 140 and diode 190. The embodiment with inductor 140 does not require a large inductor and thus, the PCB area can be kept small. These solutions, which turn off transistors 110 and 160 during a data transmission improve the data throughput to a couple of 100 kBits/s.

Figure 4:
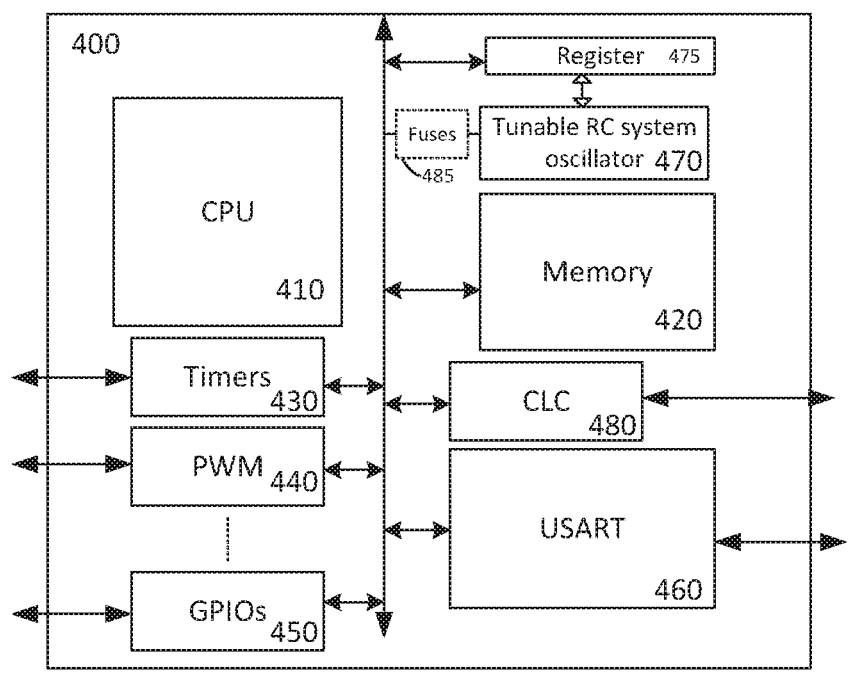
FIG. 4 shows an exemplary microcontroller suitable for the first and/or second device.

Microcontrollers 120, 180 can be any type of microcontroller, in particular, many microcontrollers manufactured by the assignee of this application are suitable microcontrollers. FIG. 4 shows one possible embodiment of a microcontroller 120, 180, shown as microcontroller 400. The microcontroller 400 comprises a central processing unit (CPU) 410 clocked by a tunable RC oscillator 470 providing a system clock for the microcontroller 400. The microcontroller 400 comprises a memory 420, general purpose input/output ports 450 and a plurality of peripherals. As an example, FIG. 4 shows four such peripherals, particularly a timer unit 430, a pulse width modulation unit 440, a configurable logic cell unit 480 and a USART 460. These peripherals may or may not have external connections to external pins of the microcontroller 400. Depending on the target design, more or less such peripherals may be required. The tunable RC oscillator 470 may be tuned through a special function register 475 via the CPU 410. Microcontroller 120, i.e. microcontroller 400 implemented in charger device 100a may not require tunable RC oscillator 470.

Figure 6:
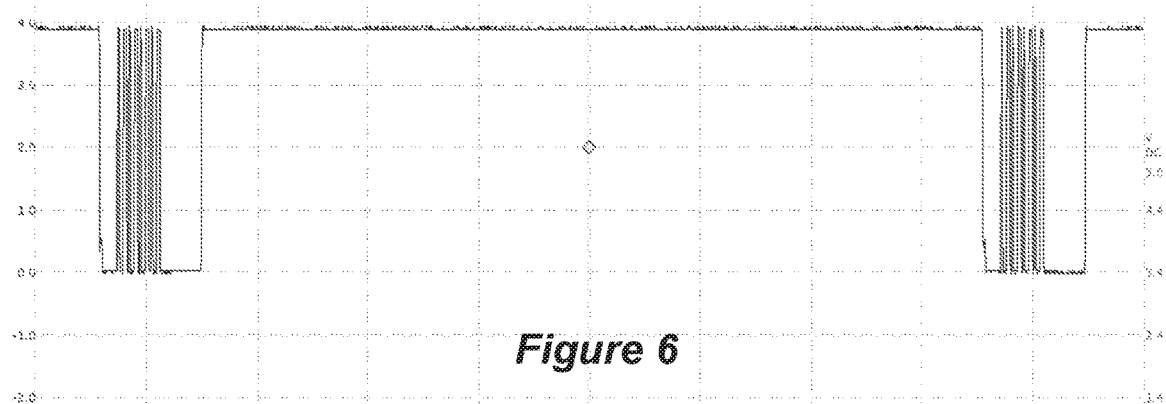
FIG. 6 shows another timing diagram of a transmission protocol according to one embodiment.

FIG. 6 shows a typical communication and power delivery timing diagram according to various embodiment, where the x-axis represents time, and the y-axis represents voltage between first and second pins 125a, b. As shown in FIG. 6, during the on cycle the voltage is steady, whereas during the off cycle the voltage first falls to a low level, then oscillates rapidly indicative of data transmission from master to slave. Since there is no slave to master transmission following, the off cycle is truncated after a timeout. The off cycle is very short in comparison to the on cycle, for example 10% or 5% or even less according to various embodiments. During the on cycle, a high current can be delivered at the rated voltage, whereas during a communication period, the data signal is a low current high frequency signal transmitting the data between the communication peripherals from one device to the other. The power parts of a switch mode charging circuit as shown in the embodiment of FIG. 2 using inductor 140 and diode 190 can be beneficially re-used. For example, the MOSFET 160 can be controlled by the microcontroller 180 to also perform the function of a boost converter in combination with inductor 140 and diode 190. Parts 140, 160, 190 and 172 enable boosting the voltage of the first device in order to charge the second devices battery. The USART 460 may be preferably a transceiver to allow for bi-directional communication. However, certain applications may only require the second device to transmit data to the first device or vice versa. Thus, according to some embodiments, one device may comprise only a transmitter and the respective other one only a receiver.

To keep the cost as low as possible, internal RC oscillators inside the microcontroller may be used to provide a respective system clock. However, these RC oscillators have a typical inaccuracy of +/−5%, resulting in a worst case scenario of +/−10% total which may be too much for the targeted modulation scheme.

Figure 3:
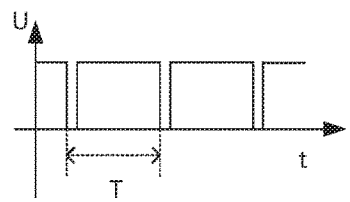
FIG. 3 shows a timing diagram for synchronization between the first device and the second device.

Two possible approaches may be used to overcome this, without limitation. FIG. 3 shows a timing diagram of the signal provided through port 'On/Off' of microcontroller 120 to the gate of MOSFET 110. Even when there is no active data exchange, power delivery is still interrupted by a short pulse. The microcontroller 120 in the charger device 100a thus acts as a master, still generating these pauses. According to one embodiment, the master always interrupts power delivery periodically independent of whether there is data to be send or not. The slave synchronizes to the falling edges and measures the time between two consecutive edges, in other words the time interval between two pauses. The master pauses for a short period of time. If the master has data to send, it starts sending and makes another short pause. After that, it waits for data coming from the slave with a given timeout. If data reception is finished or a timeout has occurred, power is switched on again. The microcontroller 180 in the holder device 100b, thus, acts as a slave. Since the slave receives the sync pulses from master side, it can either continuously tune its internal clock, if supported by hardware, or insert/remove dead cycles (NOPs) to adjust to the given timing frame by the master. FIG. 2 shows tunable RC system oscillators 121, 181 in each of the respective microcontrollers 120, 180. However, only the microcontroller operating as a slave device may need to provide for this functionality according to some embodiments. According to other embodiments, only the master microcontroller 120 may have a tunable RC oscillator 121 and varies its frequency until it receives valid confirmation data from the slave. Once the system clocks of the microcontrollers are synchronized, the two asynchronous communication peripherals can communicate directly at high speed.

As an alternative, a modulation scheme, that can reconstruct the clock source out of its modulated signal may be used. In such a case, no additional tuning of the system clocks is necessary. Preferably, this reconstruction may be of low complexity to run it on, for example, a low cost 8-bit microcontroller. Traditional approach for such a reconstruction is Manchester coding, but this may need a lot of computing power to decode or dedicated hardware. However, core independent peripherals may be used to perform a hardware decoding in many microcontrollers available, for example, microcontrollers manufactured by the assignee of the present application.

Figure 7:
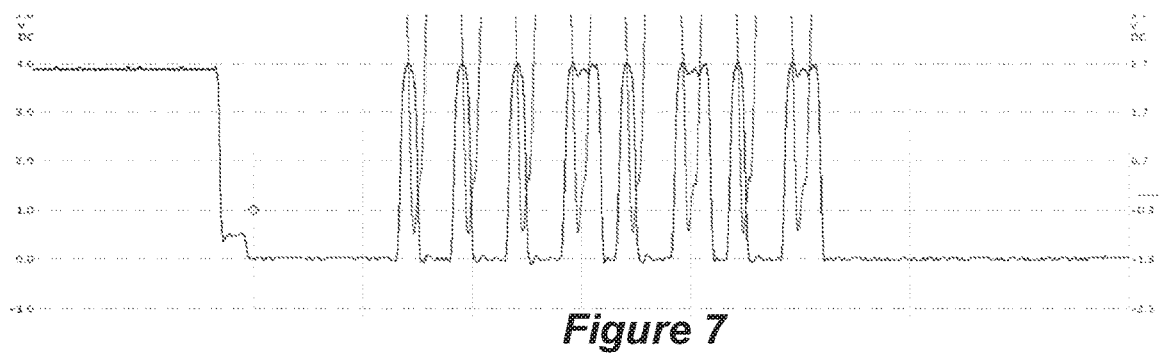
FIG. 7 shows another timing diagram of a transmission protocol according to yet another embodiment.

FIG. 7 shows in more detail the short communication phase of systems according to various embodiments. The scaling on the left shows the voltage level at the communication line. The truncated curve represents the reconstructed clock. With the rising edge, either a logic '1' or '0' is sampled. Scaling has been shifted to show the crossing between the two signals. According to some embodiments, a 1/3-2/3 coding may be used as shown in FIG. 7. Such a coding uses different length pulses representing a "0" and a "1" as visible in FIG. 7. Such an encoding can be easily decoded in either software with highly reduced needs for computing time or even in hardware, for example, by using configurable logic cells, timers, and/or input capture peripherals available in microcontrollers manufactured by the assignee of the present application. By making use of the core independent peripherals of microcontrollers manufactured by the assignee of the present application, this can be achieved with almost no CPU intervention. This will save processing time for other computing tasks like a battery charging algorithm.

In a lot of portable devices, not only communication is needed, but also battery charging. During the development of the various embodiments of the present application, the inventors found out, that this could be beneficially combined. The bill of materials is improved by reusing components that are already there to implement a battery charger. For example, by just adding an inductor and a second diode to the embodiment of FIG. 2, a boost converter can be formed to charge the battery 170 using the inductor 140 and diode 190. The only remaining additional part for communication is MOSFET 110 in the charger device, since MOSFET 160 is being used for both communication and as a boost converter device.

To be able to switch the MOSFETs 110, 160, at the right time, the clocks on both MCUs 120, 180 need to be synchronized as mentioned above. To this end, tunable RC oscillators may be provided within the microcontrollers.

If the voltage of the charging circuit is close to the voltage of the battery to be charged as it is with some embodiments, a buck-boost topology can be used, which means the voltage can be either increased or decreased depending on the charging state of the battery. However, such a topology usually requires capacitors $C_B$ at the inputs and the outputs which will also block communication between the two devices as shown in the top of FIG. 5 depicting general buck and boost circuits.

Figure 5:
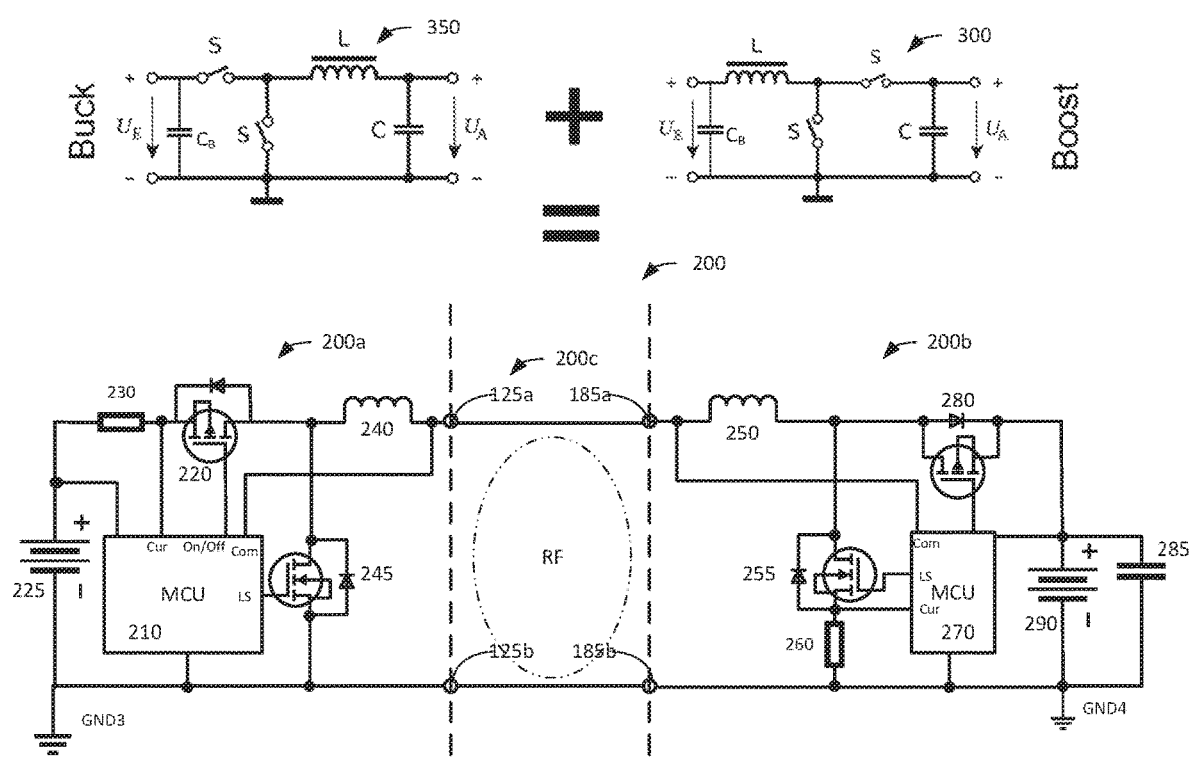
FIG. 5 shows a second embodiment showing a charger device and a holder device.

FIG. 5 shows another embodiment of a system 200 for solving this problem. The charger device 200a comprises microcontroller 210, battery 225, and first MOSFET 220 in a similar configuration as the embodiment of FIG. 2. In addition, the charger device 200a comprises an inductor 240 coupled between first contact pin 125a of charger device 200a and the output of MOSFET 220, i.e. the source of MOSFET 220. A second MOSFET 245 controlled via port LS of microcontroller 210 may be provided which couples ground of the charger device 200a with the node between inductor 240 and resistor 230. Two wire pin interface 200c corresponds to two wire pin interface 100c.

The holder device 200b comprises microcontroller 270, battery 290, inductor 250, and first MOSFET 280 in a similar configuration as shown in FIG. 2. In addition, FIG. 5 shows a second MOSFET 255 for the holder device 200b controlled via a control port LS of microcontroller 270, which second MOSFET 255 is coupled between a node between inductor 250 and MOSFET 280 and ground of holder device 200b. Optionally, a resistor 260 be inserted between the MOSFET 255 and ground of the holder device 200b wherein a node between the resistor and MOSFET 255 is coupled with a current measurement input Cur of microcontroller 270. As mentioned with FIG. 2, the embodiment of the holder device 200b actually shows capacitor 285 coupled in parallel with battery 290. Again, the microcontrollers 210 and 270 may be any suitable microcontrollers, such as, for example the microcontroller as shown in FIG. 4.

FIG. 5 also shows in the top portion, for explanation only, typical circuits for a buck converter 350 and for a boost converter 300. It is known in the art to combine these two topologies into a so-called buck-boost converter. Such a combination, basically combines the two circuits by connecting both circuits in series and omitting the inductor L and capacitor C of the buck topology by using the inductor L and capacitor C of the boost topology when in buck mode. Such a basic 4 switch buck-boost converter is formed by the circuit shown in FIG. 5, as will be described further below.

The circuit shown in FIG. 5 uses this concept by splitting the inductor L of such a buck-boost converter into two inductors 240 and 250, one of them arranged in each of charger device 200a and holder device 200b. When the charger and holder device are coupled, i.e. first and second contact pins 125a, b are in contact with first and second contact pins 185a, b, the MOSFETs 220, 245, 280, and 255 are controlled to operate the coupled devices in either a buck mode or a boost mode or a buck-boost mode. In buck mode, MOSFET 280 is closed and MOSFET 220 switch operation is controlled. MOSFET 245 may either work as parasitic diode or may be actively switched complementary to MOSFET 220. In boost mode, MOSFET 220 is closed and MOSFET 255 switch operation is controlled. MOSFET 280 may either work as parasitic diode or may be actively switched complementary to MOSFET 255. In buck-boost mode, MOSFET 220 and 255 switch operations are controlled. MOSFET 245 and 280 may either work as parasitic diodes or may be actively switched complementary to MOSFET 220 and 255. Similar to the operation of the embodiment shown in FIG. 2, both operating modes are interrupted during a short communication phase in which the MOSFETs 220, 280, 245, 255 are controlled to provide decoupling from the power source 225 and battery 290. This operation provides for off cycles during which communication takes place. The inductors 240 and 250 further increase the RF impedance to charger and holder side. This operation prevents passing RF-power during a communication phase to either charger or holder device. This is indicated in FIG. 5 by the dotted circle marked RF. An RF modulated signal can now only flow in the loop between the nodes 125a, 185a, 185b and 125b. from one communication port Com of microcontroller 210 to the other communication port Com of microcontroller 270 and vice versa. The inductors 240, 250 prevent the RF leaving the loop.

Figure 8:
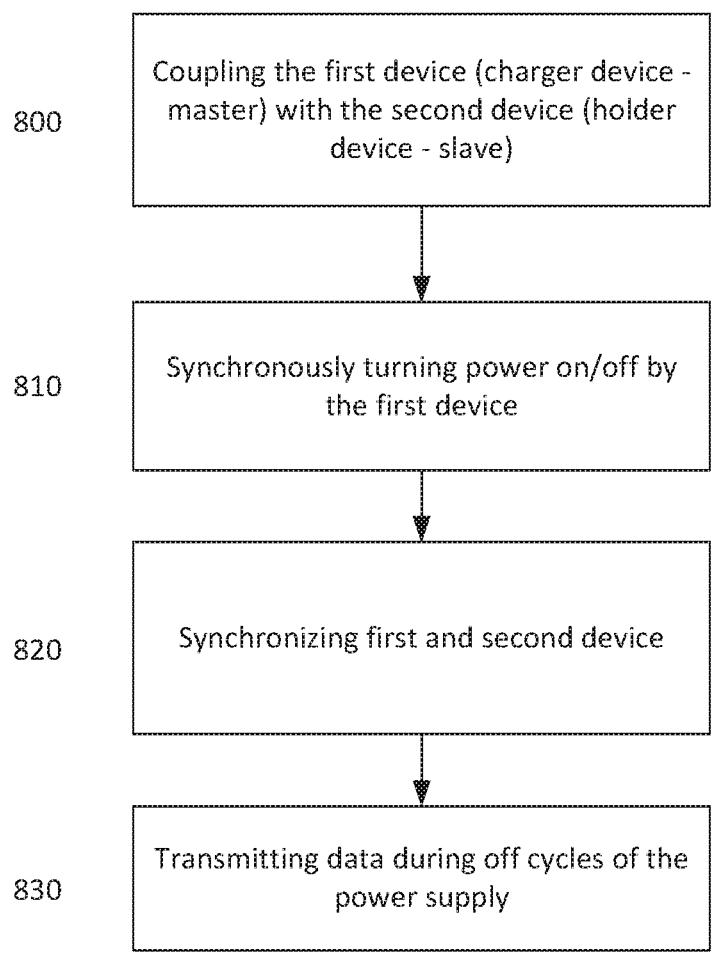
FIG. 8 shows an exemplary flow chart of the method according to various embodiments.

FIG. 8 shows a flow chart of a method for transmitting power and data through a two pin connection interface according to various embodiments as discussed above. In a first step 800 the first device (charger device) is coupled with the second device (holder device), for example, through a connecting cable or directly as discussed above. In a second step the first and second MOSFET in the first and second device are synchronously turned on and off, wherein an off-cycle is short in comparison to an on-cycle. The second device can then synchronize to the first device according to one embodiment as shown in step 820. In step 830, during an off-cycle a data transfer between the first and second device takes place through the first and second communication peripherals of the first and second device, respectively. Step 810 may comprise synchronizing a system clock of the second microcontroller to a system clock of the first microcontroller.

The step of synchronizing may comprise synchronizing a system clock of the second microcontroller to a system clock of the first microcontroller. The first device may operate as a master and the second device may operate as a slave, wherein during a synchronization cycle, the master delivers power to the slave interrupted by pauses having a predefined length and wherein the slave may use an interval length between two pauses for synchronization to the master. The slave may insert or remove dead cycles in step 820 to adjust to a given timing frame by the master. The microcontroller of the slave comprises a tunable RC oscillator and wherein the slave tunes the tunable RC oscillator to synchronize with the master.

In summary, the various embodiments discussed above interrupt the power source supply instead of continuously modulating a constant power source. Any oscillator inaccuracy can be overcome by adjusting system clocks or by a modulation scheme that can be easily encoded/decoded. A combined charger/communication circuit requires few additional components. In a buck-boost embodiment a split inductor can be used to prevent passing of RF power. The various embodiments provide for a reduced bill of material and PCB space and therefore cost as compared to the prior art system of FIG. 1.

The invention claimed is:
1. A system for transmitting power and data through a two pin connection interface comprising:
   a first device comprising:
      a power source or a connection to a power source, a first microcontroller coupled with the power source and comprising a first communication peripheral coupled with a pin of the first device and a first control port coupled with a gate of a first MOSFET of the first device whose switch path couples the power source with the pin of the first device;

and a second device comprising:

a battery, a second microcontroller comprising a second communication peripheral coupled with a pin of the second device and a second control port coupled with a gate of a second MOSFET whose switch path couples the battery with the pin of the second device, wherein the pin of the second device is configured to be coupled with the pin of the first device;

wherein, when the pin of the second device is coupled with the pin of the first device said first and second MOSFET are synchronously turned on and off, wherein an off-cycle is short in comparison to an on-cycle, and wherein during an off-cycle a data transfer between the first and second device takes place through the first and second communication peripherals of the first and second device, respectively.

2. The system according to claim 1, wherein at least the microcontroller of the second device comprises a tunable RC oscillator.

3. The system according to claim 2, wherein the tunable RC oscillator is tuned through a special function register of the microcontroller.

4. The system according to claim 2, wherein the tunable RC oscillator is tuned through programmable fuses.

5. The system according to claim 1, wherein the first device is a charger device and the second device is a holder device.

6. The system according to claim 5, wherein the holder device is configured to be plugged into the charger device.

7. The system according to claim 5, wherein the holder device is an e-cigarette and wherein a ratio between transmitting data and supplying power is in the range of 5-10%.

8. The system according to claim 1, further comprising an inductor coupled between the switch path of the second MOSFET and the battery and a reverse biased diode coupled between ground and a node between the switch path of the second MOSFET and the inductor.

9. The system according to claim 8, further comprising a capacitor in parallel with the battery.

10. The system according to claim 1, wherein the first device is configured to operate as a master and the second device is configured to operate as a slave, wherein during a synchronization cycle, the master is configured to deliver power to the slave interrupted by pauses having a predefined length and wherein the slave is configured to synchronize to the master and to transmit a confirmation of synchronization back to the master.

11. The system according to claim 10, wherein the slave is configured to insert or remove dead cycles to adjust to a given timing frame by the master.

12. The system according to claim 10, wherein the microcontroller of the slave comprises a tunable RC oscillator and wherein the slave is configured to tune the tunable RC oscillator to synchronize with the master.

13. The system according to claim 1, wherein the first device further comprises: a first inductor coupled between the switch path of the first MOSFET and the first pin of the first device and a third MOSFET controlled by the first microcontroller having a switch path coupled between ground of the first device and a node between the switch path of the first MOSFET and the first inductor; and wherein the second device further comprises: a second inductor coupled between the switch path of the second MOSFET and the first pin of the second device and a fourth MOSFET controlled by the second microcontroller having a switch path coupled between ground of the second device and a node between the switch path of the second MOSFET and the second inductor.

14. The system according to claim 13, further comprising within the first device a first resistor between the power source and the first MOSFET, wherein the first resistor is further coupled with the first microcontroller.

15. The system according to claim 13, further comprising within the second device a second resistor between the ground of the second device and the switch path of the fourth MOSFET, wherein the second resistor is further coupled with the second microcontroller.

16. The system according to claim 1, wherein the power source is a battery.

17. A method for transmitting power and data through a two pin connection interface comprising a first device having a power source, a first microcontroller coupled with the power source and comprising a first communication peripheral coupled with a first pin of the first device and a first control port coupled with a gate of a first MOSFET whose switch path couples the power source with the first pin of the first device, and a second device having a battery, a second microcontroller and comprising a second communication peripheral coupled with a first pin of the second device and a second control port coupled with a gate of a second MOSFET whose switch path couples the battery with the first pin of the second device, the method comprising the steps of:

coupling the first device with the second device through said respective first pins; and synchronously turning said first and second MOSFET on and off, wherein an off-cycle is short in comparison to an on-cycle, and wherein during an off-cycle a data transfer between the first and second device takes place through the first and second communication peripherals of the first and second device, respectively.

18. The method according to claim 17 further comprising the step of synchronizing a system clock of the second microcontroller to a system clock of the first microcontroller.

19. The method according to claim 17 further comprising the step of synchronizing a system clock of the second microcontroller to a system clock of the first microcontroller.

20. The method according to claim 17, wherein the first device operates as a master and the second device operates as a slave, wherein during a synchronization cycle, the master delivers power to the slave interrupted by pauses having a predefined length and wherein the slave uses an interval length between two pauses for synchronization to the master.

21. The method according to claim 20, wherein the slave inserts or removes dead cycles to adjust to a given timing frame by the master.

22. The method according to claim 20, wherein the microcontroller of the slave comprises a tunable RC oscillator and wherein the slave tunes the tunable RC oscillator to synchronize with the master.

23. A system for transmitting power and data through a two pin connection interface comprising:

a first device comprising:

a power source or a connection to a power source, a first microcontroller coupled with the power source and comprising a first communication peripheral coupled with a first pin of a first connector of the first device and a first control port coupled with a gate of a first MOSFET whose switch path couples the power source with the first pin of the first connector, a first inductor coupled between the switch path of the first MOSFET and the first pin of the first connector and a third MOSFET controlled by the first microcontroller having a switch path coupled between ground of the first device and a node between the switch path of the first MOSFET and the first inductor;

a second device comprising:

a battery, a second microcontroller coupled with the battery and comprising a second communication peripheral coupled with a first pin of a second connector of the second device and a second control port coupled with a gate of a second MOSFET whose switch path couples the battery with the first pin of the second connector, wherein the first pin of the second connector is configured to be coupled with the first pin of the second connector, a second inductor coupled between the switch path of the second MOSFET and the first pin of the second connector and a fourth MOSFET controlled by the second microcontroller having a switch path coupled between ground of the second device and a node between the switch path of the second MOSFET and the second inductor;

wherein, when said first and second device are coupled through said respective first pins, the first, second, third and fourth MOSFET are controlled to operate the coupled devices in a buck mode and/or a boost mode, wherein during a communication cycle said first, second, third, and fourth MOSFET are synchronously turned off, wherein during an off-cycle a data transfer between the first and second device takes place through the first and second communication peripherals of the first and second device, respectively.

* * * * *